United States Patent [19]

Kunen

[11] E Patent Number: Re. 33,285

[45] Reissued Date of Patent: Jul. 31, 1990

[54] TOUCH CONTROLLED SWITCH FOR A LAMP OR THE LIKE

[76] Inventor: Scott M. Kunen, 2091-A Wantagh Ave., Wantagh, N.Y. 11793

[21] Appl. No.: 352,865

[22] Filed: May 17, 1989

Related U.S. Patent Documents

Reissue of:

[64] Patent No.: 4,668,877
Issued: May 26, 1987
Appl. No.: 754,245
Filed: Jul. 12, 1985

U.S. Applications:

[63] Continuation-in-part of Ser. No. 620,070, Jun. 13, 1984, abandoned, which is a continuation-in-part of Ser. No. 590,185, Mar. 16, 1984, abandoned.

[51] Int. Cl.[5] ..... H05B 37/02

[52] U.S. Cl. ..... 307/116; 307/112; 307/157; 200/DIG. 2; 315/150; 315/209 R; 315/DIG. 4; 323/904; 323/905

[58] Field of Search ..... 307/112, 113, 114, 115, 307/116, 117, 157; 200/DIG. 1; 340/555, 581, 583, 584; 315/209 R, 362, 361, 76, 150, DIG. 4; 323/904, 905

[56] References Cited

U.S. PATENT DOCUMENTS

| | | | |
|---|---|---|---|
| 2,782,308 | 2/1957 | Rug | 331/65 |
| 2,810,066 | 10/1917 | Green | 362/395 |
| 3,641,410 | 2/1972 | Vogelsberg | 318/345 |
| 3,805,096 | 4/1974 | Hamilton, II | 307/308 |
| 4,119,864 | 10/1978 | Petrizio | 361/181 X |
| 4,125,794 | 11/1978 | Pohl | 315/362 |
| 4,152,629 | 5/1979 | Raupp | 315/362 |
| 4,211,959 | 7/1980 | Deavenport et al. | 315/361 |
| 4,213,061 | 7/1980 | Conner | 307/116 |
| 4,221,975 | 9/1980 | Ledniczki et al. | 307/116 |
| 4,237,386 | 12/1980 | Instance | 307/116 |
| 4,246,494 | 1/1981 | Foreman et al. | 307/116 |
| 4,246,533 | 1/1981 | Chiang | 307/116 |
| 4,250,432 | 2/1981 | Kohler | 307/116 |
| 4,275,383 | 6/1982 | White et al. | 340/286 |
| 4,289,972 | 9/1981 | Wern | 315/362 X |
| 4,307,302 | 12/1981 | Russell | 307/116 X |
| 4,323,829 | 4/1982 | Whitney et al. | 307/116 |
| 4,360,737 | 11/1982 | Leopold | 307/116 |
| 4,380,721 | 4/1983 | Bullock et al. | 315/76 X |
| 4,490,625 | 12/1984 | Dilly | 315/362 |
| 4,558,261 | 12/1985 | Cheng | 315/362 X |
| 4,584,519 | 4/1986 | Gruodis | 323/904 X |
| 4,591,765 | 5/1986 | Beck | 315/362 X |
| 4,668,876 | 5/1987 | Skarman | 323/904 X |
| 4,701,676 | 10/1987 | Gibson | 307/116 |

*Primary Examiner*—William M. Shoop, Jr.
*Assistant Examiner*—Paul Ip
*Attorney, Agent, or Firm*—Eliot S. Gerber

[57] ABSTRACT

A small electronic module to regulate the power delivered to a lamp or similar appliance is plugged into the household electrical outlet and the lamp to be controlled is, in turn, plugged into the module. Each time the lamp is touched the power to the bulb increases by one step, typically in the sequence OFF, DIM, INTERMEDIATE, FULL, OFF. The module device operates by sensing the capacitance change when the lamp is touched and communication between the lamp and the device occurs through the lamp cord.

16 Claims, 10 Drawing Sheets

TOUCH CONTROLLED SWITCH FOR A LAMP OR THE LIKE

Matter enclosed in heavy brackets [ ] appears in the original patent but forms no part of this reissue specification; matter printed in italics indicates the additions made by reissue.

BACKGROUND OF THE INVENTION

This application is a continuation-in-part application based upon my copending application Ser. No. 620,070, filed June 13, 1984, and now abandoned, which was a continuation-in-part of my application Ser. No. 590,185, filed Mar. 16, 1984 and now abandoned, both entitled "Touch Controlled Switch For A Lamp Or The Like".

The present invention relates to an electronic power control device which is actuated by a person's touch and controls the electrical power to a lamp or another electrical load.

At the present time several "touch controlled lamp dimmers" are commercially available in which touching an electrically conductive part of the lamp causes the power level to the bulb to change, either continuously or in discrete steps. However, they all require a direct wire connection of the control device to the lamp and the mounting of the touch control device on the outside or inside of the lamp. Consequently, such presently available touch control devices can be used only with the lamps to which they are attached and electrically and/or mechanically connected.

OBJECTIVES AND FEATURES OF THE INVENTION

It is an objective of the present invention to provide an electrical power control device which operates by touch and which does not require a wired electrical connection to the lamp or appliance.

It is a further objective of the present invention that the control device be enclosed in a small box which may be plugged into a conventional wall socket and that the lamp will be plugged into the control device; so that any lamp can be converted at will to a touch controlled lamp without altering the lamp and without additional wiring.

It is a still further objective of the present invention to provide such a control device that will detect a capacitance change of the order of 1% when the operator touches the lamp, and which uses the lamp's own cord as the only means of communications to the control device.

It is a still further objective of the present invention to provide such a control device which is unaffected by, and immune to, false activation from the normal household current (50/60 cycle sine wave power) in the lamp cord; broadband radio frequency interference (RFI) spectrum as a result of triac control of power to the load; high ambient RFI environment and intermittent RFI; power line transients and power interruptions.

It is a still further objective of the present invention to provide such a control device which will have a low emitted RFI field intensity and harmonic spectrum, so as not to interfere with other electrical appliances.

It is a still further objective of the present invention to provide such a control device that will be relatively low in cost, highly reliable and may be manufactured by conventional electronic manufacturing plants and methods.

BRIEF DESCRIPTION OF THE DRAWINGS

Other objectives of the present invention will be apparent from the following detailed description taken in conjunction with the accompanying drawings.

In the drawings.

DETAILED DESCRIPTION OF THE INVENTION

Figure 1:
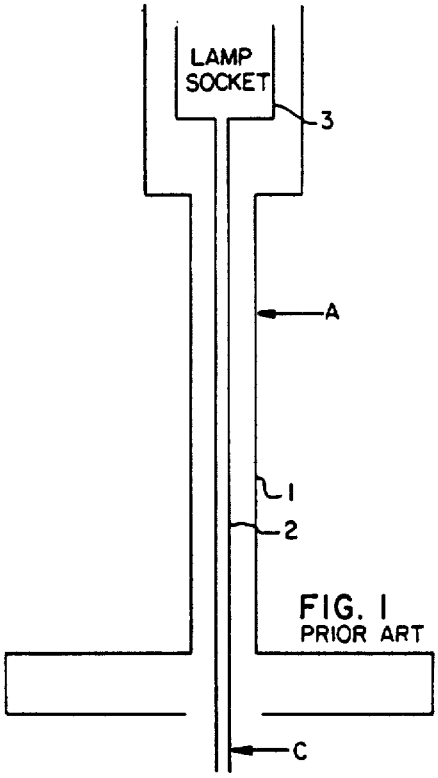
FIG. 1 PRIOR ART
FIG. 1 is a schematic illustration of a prior art conventional incandescent lamp.

The structure of a typical prior art incandescent lamp (lamp fixture) is shown in FIG. 1. The center tube 1, which is a metal tube, is the main structural support of the lamp. It is a conduit for the portion of lamp cord 2 which is within the lamp. The lamp socket 3 provides electrical contact to the bulb and is electrically isolated from the tube 1. The lamp cord 2 is typically a two-conductor parallel insulated wire.

The present invention uses the lamp cord 2 to communicate to the remote control device. There is no electrically conductive path between the lamp cord and the lamp structure in a properly wired lamp, i.e., there is no leakage of current from the line cord to the lamp. However, the lamp cord within the center tube 1 and center tube form an air dielectric capacitor. Thus, there is capacitive coupling between the lamp cord and the lamp.

The mechanism of touch sensing is made possible by electrically sensing a change in capacitance of the lamp when it is touched. When touched, the self capacitance of the lamp is augmented by the self capacitance of the body of the person touching the lamp.

Figure 2:
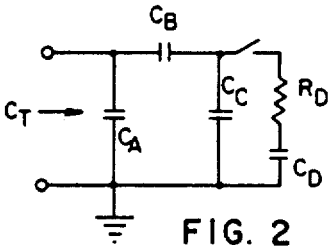
FIG. 2 is a circuit diagram indicating the capacitance relationship for an analysis of the present invention.

An analytical model of the capacitances of interest is shown in FIG. 2, where: $C_A$—capacitance of lamp cord; $C_B$—capacitive coupling between lamp cord and lamp; $C_C$—capacitance of lamp structure; $C_D$—body capacitance of operator; and $R_D$—resistance of contact point between lamp and operator.

The total capacitance of the lamp and cord is therefore:

$$C_T = C_A + (C_B C_C / C_B + C_C)$$

When the lamp is touched, this is increased to:

$$C_T' = C_A + [C_B(C_C + C_D)/C_B + C_C + C_D]$$

assuming $R_D = 0$.

Typical capacitance values which have been measured are as follows: $C_A$—25 pf (8 feet of 18 gauge lamp cord, conductors shorted); $C_D$—65 pf (average man); $C_B$—60 pf (1.5 feet of 0.25" ID steel tubing with 1.5 feet pf cord running through it); and $C_C$—40 pf (typical metal lamp). Thus: $C_T$=49 pf (approximately) and $C_T$=63 pf (approximately), which represents a +28% change. In reality, RD does not equal zero but assumes a value from some hundreds of ohms to several megohms due to skin resistance and the varnish typically used on the metal portions of lamps. This increase in $R_D$ means that $C_D$ and consequently $C_T'$ is decreased. Thus, the capacitance change, i.e., the difference between $C_T$ and $C_T'$, can be as little as +1% in practice. The touch sense device must, therefore, respond to as little as a 1% change in capacitance when the lamp is touched. Earth ground is taken as the zero reference in this device, since the net charge of the earth is generally equal to zero and it is effectively an infinite source and sink for charge. Thus, the level of charge of an object, and hence its capacitance, will be measured relative to earth ground.

Figure 5:
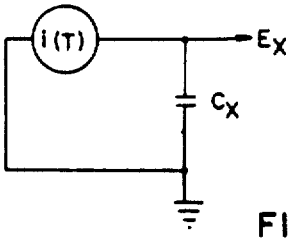
FIG. 5 is a circuit diagram used in explaining certain principles of the present invention.

The following method is used to determine the value of a capacitance. Referring to FIG. 5, a controlled current source is configured to force charge into capacitor $C_x$. The value of $E_x$ at time T=1 will be $$E_x = E_o + 1/C_x \int_{T=0}^{T=1} i(T)dT$$

where: $E_0$ is the initial voltage across capacitor at T=0; i(T) is the current as a function of time; and T is the time. Thus, if the forcing function and the initial charge level of the capacitor are known, the capacitance is inversely proportional to $E_x$ after time T or, conversely, proportional to the time necessary for the voltage to rise to a given $E_x$.

Figure 3:
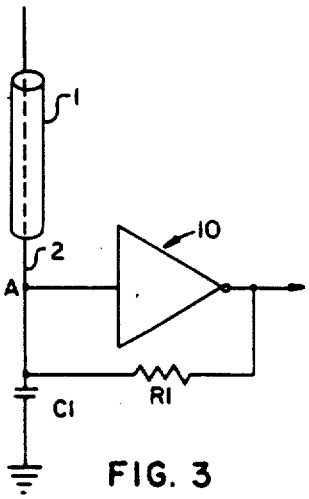
FIG. 3 is a schematic illustration of the basic operating principle of the present invention.

The capacitance measurement technique found to be satisfactory in the context of the present invention is adapted in FIG. 3. The capacitance communicated through the lamp cord is effectively placed in parallel with the lumped capacitor C1, giving a total capacitance of $C_T$(total capacitance of lamp and cord without being touched). The circuit 10 is a non-linear oscillator, specifically an astable multivibrator, whose operation will be discussed in a later section. The capacitance $C_T$ is charged for a forcing function created by the bi-stable output of the Schmidt trigger buffer through resistor R1. The voltage at point A will rise exponentially until the upper trigger level of the buffer is reached, at which time the buffer will change state. The capacitor C1 will then discharge exponentially until the lower trigger level is reached. Thus the period of the oscillator is proportional to $C_T$. Essentially there is capacitance to frequency conversion, i.e., the higher the capacitance the lower the frequency.

ANALOG/DIGITAL EMBODIMENT

Figure 4:
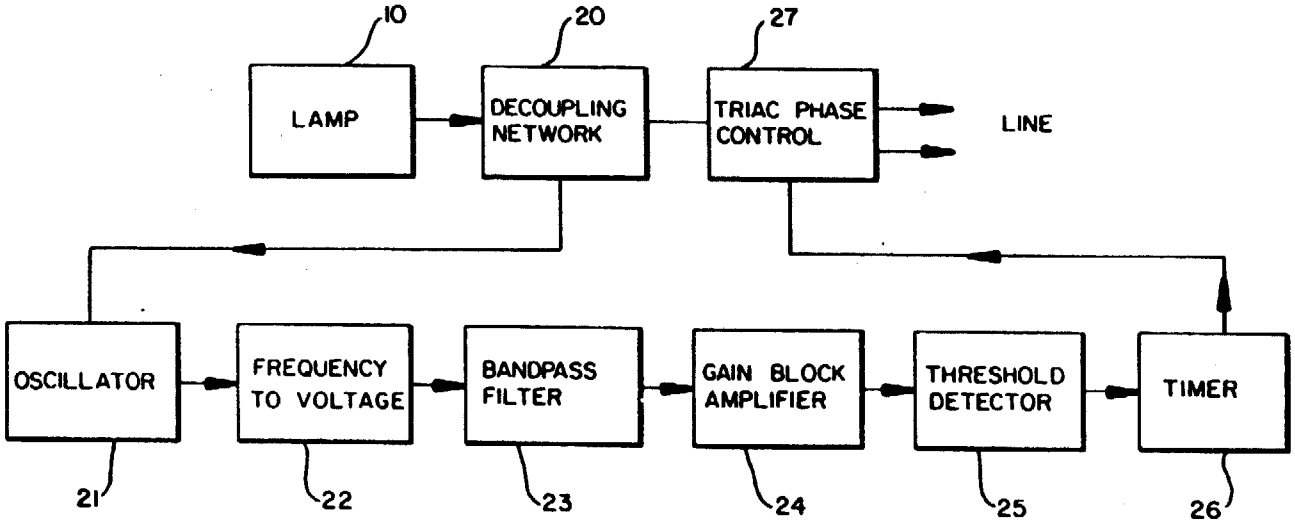
FIG. 4 is a block diagram illustrating the first embodiment of the present invention.

One preferred embodiment of the present invention which fulfills the design objectives and is commercially feasible is depicted in FIG. 4, and will be described in detail in the following sections. It is a hybrid analog/digital circuit.

As shown in FIG. 4, the lamp 10 is connected to the decoupling network 20. The decoupling network performs the functions of isolating the lamp cord from the power line at oscillator frequency; preventing 50/60 cycle power frequency from affecting the oscillator; preventing harmonics generated by the triac from affecting the oscillator; forcing the lamp cord to operate in common mode at oscillator frequency; establishing RF earth ground reference for capacitance measurement; and reducing triac "hash" radiation. The decoupling network 20 is connected to the oscillator 21.

The oscillator 21 is connected to the frequency to voltage converter 22 which generates a varying DC voltage whose average DC magnitude is a function of oscillator frequency. The higher the capacitance, the lower is the frequency of the oscillator 21 and the lower is the DC voltage generated by the frequency to voltage converter 22.

The bandpass filter 23, which is connected to the frequency to voltage converter 22, restricts the frequency response of the system to that range of frequencies which are generated by a valid touch, and rejects other frequencies which are treated as noise in the system.

The bandpass filter 23 is connected to amplifier 24 which raises the DC voltage output of the frequency to voltage converter 22 to a level concommitant with requirements of subsequent sections.

The amplifier 24 is connected to the threshold detector 25 which rejects all input signals below a certain predetermined minimum voltage level in order to prevent responses to invalid disturbances. The threshold detector 25 is connected to the timer 26 which functions to insure that the threshold detector output 25 is TRUE for a certain minimum length of time before a valid touch input will be recognized. It insures that a certain minimum time must elapse before a second valid touch input can be recognized. The effect is to "debounce" touch input, much like rapid sequential keyboard key depressions are "debounced" so that only the first key depression acts as a signal.

The timer 26 is connected to the phase controller 27. The phase controller 27 controls the triac conduction angle to provide three or more discrete power levels to the light bulb, plus OFF. The power level will advance one step in the repeating sequence OFF, LOW, INTERMEDIATE, HIGH, OFF each time a valid touch input is recognized.

DESCRIPTION OF OSCILLATOR

The oscillator 21 is adpated to provide touch sensitivity without radiating harmonic spectrum. It should be immune to ambient RF fields. Preferably oscillator 21 is an astable multivibrator based on a Schmidt trigger buffer, whose elementary form is shown in FIG. 3. As shown in FIG. 3, the frequency of oscillator 21 is inversely proportional to the time constant of R1 - C1, and the width of the hysteritic window VHY. The advantages of this configuration, in addition to the use of few components, are:

1. Low amplitude at point A. The maximum amplitude at this point (and thus the radiated power) is bounded by the hysteritic window which is about 1 volt at the chosen $V_{DD}$ of around 5.5 volts.

2. The waveform at point A is an exponentially increasing-decreasing function. This tends to reduce the harmonic spectrum relative to the square waveforms commonly encountered in digital circuits.
3. The impedance level at point A is quite low, since R1 has a value of typically 2k ohms. The ambient RF energy intercepted by the lamp cord is not of sufficient amplitude to significantly affect oscillator operation.
4. Inherent noise immunity of digital circuits. A linear oscillator is not used since it may operate as a linear amplifier and pass along spurious signals picked up by the lamp cord to the subsequent RF demodulator.

There are two major causes of oscillator disturbance. The first is synchronization of the oscillator to an external signal close to the natural frequency, i.e., the oscillator may phase lock if the amplitude of the external signal is high enough. The second is random jitter of the oscillator due to broadband ambient RF fields or occasional high energy pulses. The circuit of the present invention has been modified to provide stability when operating in an adverse environment. Typical sources of interference include: commercial broadcasting stations and amateur radio transmitters, automotive ignition systems, capacitor start electric motors, furnace igniters, and general switching transients. Extensive testing of this device has shown the probability of false activation by any of the above-mentioned interferences is extremely low in a consumer environment.

Figure 6:
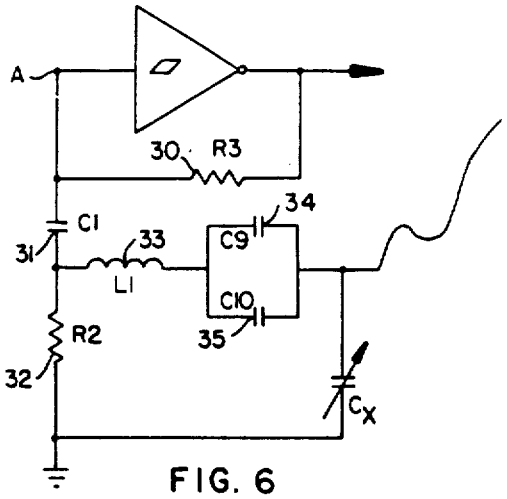
FIG. 6 is a circuit diagram of the basic form of the oscillator circuit of the present invention.
Figure 7:
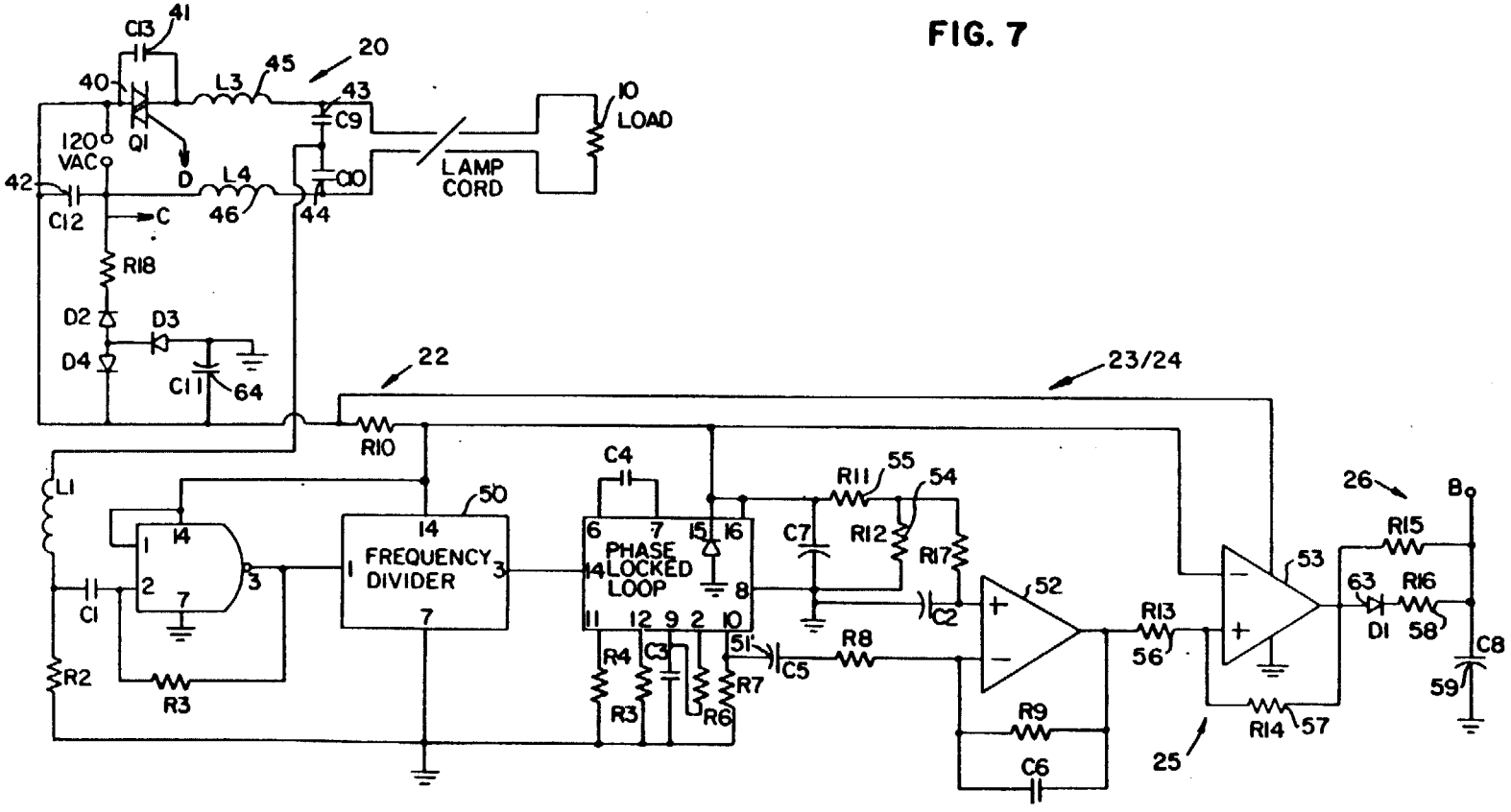
FIG. 7 is a circuit diagram of a portion of the first embodiment of the present invention and relates to the sensing of the touch.

FIG. 7 shows the preferred oscillator circuit and FIG. 6 shows the circuit of FIG. 7 redrawn for analytical purposes. As shown in FIGS. 6 and 7, the basic frequency determining network consists of resistor 30 and the series string capacitor 31 and resistor 32. Capacitor 31, instead of being returned to ground directly as in the normal configuration, is grounded through resistor 32. This increases the operating frequency of the oscillator since point A can float on top of resistor 32, allowing the buffer to reach trigger level in less time. Thus the frequency is proportional to the impedance of the parallel network of resistor 32 and the reactances of inducance 33 (capacitor 34+capacitor 35) and $C_L$ (the effective impedance of the lamp and cord). The frequency of the oscillator will deviate around its centerpoint with variations $C_L$. Inductance (choke) 33 and resistor 32 form a low pass filter to block stray high frequency energy; conversely choke 33 and $C_L$ form a low pass filter to attenuate oscillator harmonics at the lamp cord. Capacitor 34+capacitor 35 and resistor 32 form a high pass filter to block the 50/60 cycle power and triac hash from the oscillator.

Figure 13:
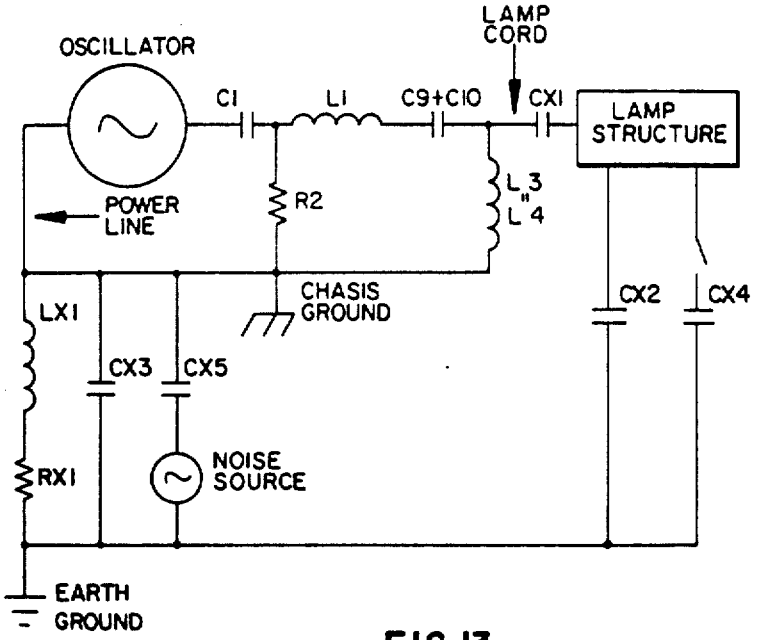
FIGS. 13 and 14 are circuit diagrams illustrating certain principles of the present invention.

An entirely different cause of oscillator disturbance is the high frequency impedance of the power line. This is a relatively complex phenomenon and will be explained in some detail. FIG. 13 is an analytical model showing all impedances affecting oscillator frequency. Component reference designators are the same as those in FIGS. 6 and 7. Exogenous impedances are also explicity designated, as follows:

CX1—capacitance between lamp structure and lamp cord;

CX2—capacitance between lamp structure and earth ground;

CX3—capacitance between power line earth ground conductor (in standard 3-wire system) and the neutral and hot conductors in common mode;

CX4—capacitance between operator and earth ground;

CX5—capacitive coupling to external noie source;

LX1—common mode self inductance between power line and earth ground;

RX1—common mode resistance between power line and earth ground.

Figure 14:
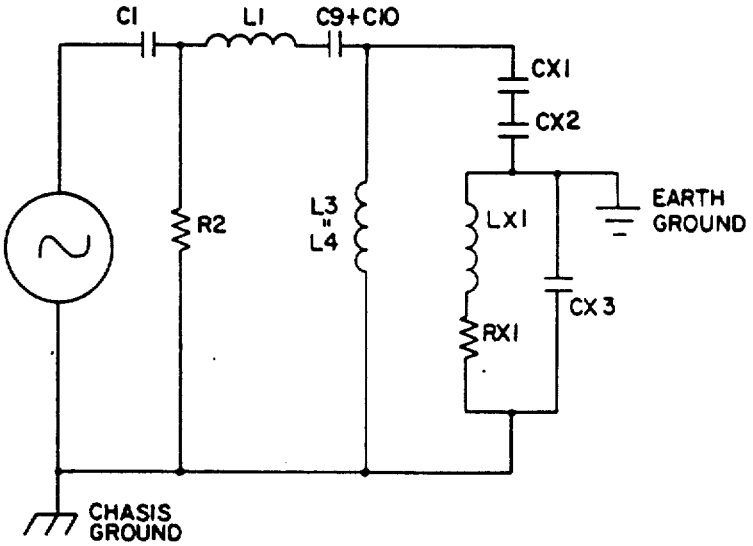

To show how the power line impedance affects oscillator frequency, the model will be redrawn from the reference frame of the oscillator. Assume $CX4=CX5=\phi$. From FIG. 14, it is evident that the power line impedance is part of the frequency determining network of the oscillator.

Ideally, the power line impedance to earth ground should be so low that it can be neglected. In residential or commercial wiring conforming to the standard electrical code a third wire, physically connected to earth ground, is present in the power cable along with the neutral and hot conductors. The common mode distributed capacitance between the line and ground conductors (CX3) constitutes a low reactance path to earth ground at operating frequency which simulates a hard earth ground. CX3 can be augmented by a physical capacitor ($\approx$1000 pf) if necessary.

However, in many houses and other buildings the wiring does not have a grounded conductor in the power line, as in old or non-conforming wiring. In this case CX3/0, and the self inductance and ohmic resistance of the line becoming significant. Changes in impedance to earth ground caused by other loads being connected or disconnected from the power line can cause the oscillator frequency to shift. Also, two wire-line writing is more susceptible to external noise generators via CX5 (radio transmitters, etc.). Thus, the probability of false actuation is greater in the case of a two-wire line than in the case of a three-wire line.

To reduce the dependence of the oscillator on power line impedance and allow the device to operate without false actuation under non-ideal conditions requires careful consideration of the component values and operating frequency. The following guidelines apply:

The operating frequency should be above AM broadcast band, above common sources of RFI, and high enough such that CX1, CX2, CX3 and CX4 have relatively low reactance. However, the frequency should be low enough to be without the capability of a CMOS oscillator operating at 5 volts and low enough so that the inductive reactance of the power line is small compared to other impedances controlling oscillator frequency. The oscillator is designed so that its operating frequency is determined principally by CX2 and CX4, and is relatively insensitive to LX1 and CX3. The interface network is designed so that choke 45 and choke 46 (FIG. 7) are as low as practical (to shunt energy intercepted by the lamp cord). Chokes 45 and 46 have low distributed capacitance.

This oscillator circuit, when combined with subsequent circuitry, has been found to effectively meet the design objectives.

DESCRIPTION OF THE OTHER CIRCUITS

The interface network 20 (line coupling network) is shown in FIG. 7 and consists of triac 40, capacitors 41–44 and inductances (chokes 45,46). This network allows the 50/60 cycle power, as modified by the triac, to flow through the lamp cord to the lamp (load) without interfering with touch sense operation.

The chokes 45,46 decouple the load from the power line at operating oscillator frequency. This is necessary since the power line is a low impedance path to earth ground. The line cord and lamp are effectively "floating" and can easily be driven by the oscillator. The series capacitors 43,44 force the lamp cord conductors to operate in common mode at oscillator frequency, effectively as a single wire, and also serve as a balance connection point to the oscillator. The triac 40, triggered by the phase control circuitry, regulates the effective power delivered to the load. The capacitor 41 provides a low impedance path to the power line across the triac. Thus, the impedance to earth ground is fairly constant on this side of choke 45 regardless of the conducting state of the triac 40. If capacitor 41 were not present, substantial frequency modulation of the oscillator would occur when the triac is triggered. The capacitor 42 prevents triac hash from entering the power line.

The frequency to voltage converter 22 consists of a frequency divider and a phase-locked loop 51. Frequency division is provided by a frequency divider 50, shown in FIG. 7 (CE 4020B integrated circuit) or similar. Its frequency ratio is 16,384:1. The output frequency is about 200 cycles, which is a suitable operating range for the subsequent phase-locked loop. The divider 50 also averages out small random deviations in oscillator frequency.

Frequency demodulation of the oscillator is accomplished by an integrated phase-locked loop 51 (CD4046B integrated circuit) or similar. Phase-locked loop theory in general and the operation of this particular circuit is well documented. The phase-locked loop output is a signal whose average DC level is proportional to the frequency of the input signal, plus an AC component generated by the voltage controlled oscillator. The output is AC coupled by capacitor 51, since only frequency deviations, not absolute frequency, are of interest.

The amplifier 24 and bandpass filter 23 are combined and both functions are performed by a first operational amplifier ("op-amp") 52 which is configured as an inverting amplifier with a gain of about 40. The band width is about 2–16 cycles (3 db down). The low end cutoff eliminates response to slow changes due to power line variations and objects brought near the lamp. The high end cutoff eliminates response to frequency modulation due to triac triggering (120 cps pulse repetition rate), and the 200 cycle operating frequency of the voltage controlled oscillator in the phase-locked loop. A valid touch to the lamp produces an abrupt stepwide change in frequency, which is amplified with full gain by the band width provided. Thus, the gain stage provides a substantial improvement in the valid signal to spurious signal ratio.

The second op-amp 53 is configured as a voltage comparator which acts as the threshold detector 25. The threshold voltage, determined by the ratio of resistors 54 to 55, is set at a level commensurate with the required touch sensitivity, as determined by experimentation. Substantial hysteresis is provided around the comparator, by resistors 56 and 57, to eliminate jitter.

The timer 26 is provided by the R-C network resistor 58-capacitor capacitor 59 which represents a time constant of 33 milliseconds positive going and 200 milliseconds negative going. This cleans up and debounces the touch response in that the comparator must have a positive dwell of more than 30 ms to result in a valid touch response, and forces a separation of about 100 ms between successive responses. This R-C network also prevents response to short transients.

The output of the touch sense section, shown in FIG. 7, is a low to high logic transition at point B in response to a valid touch input. The relatively slow rise and fall times can squared up by a Schmidt trigger buffer if required. Each stage in the touch sense section, from the oscillator to the timer, is designed to reduce the probability of invalid response, while maintaining sufficient sensitivity to cope with the problems of real-world lamps, which are often varnished, enameled, heavily oxidized or rusty.

The triac phase control circuit 19 delivers three or more discrete power levels to the load, plus OFF, by varying the conduction angle of the triac in conventional fashion. This circuit will be discussed briefly. There are integrated circuits commercially available which perform this function.

Figure 8:
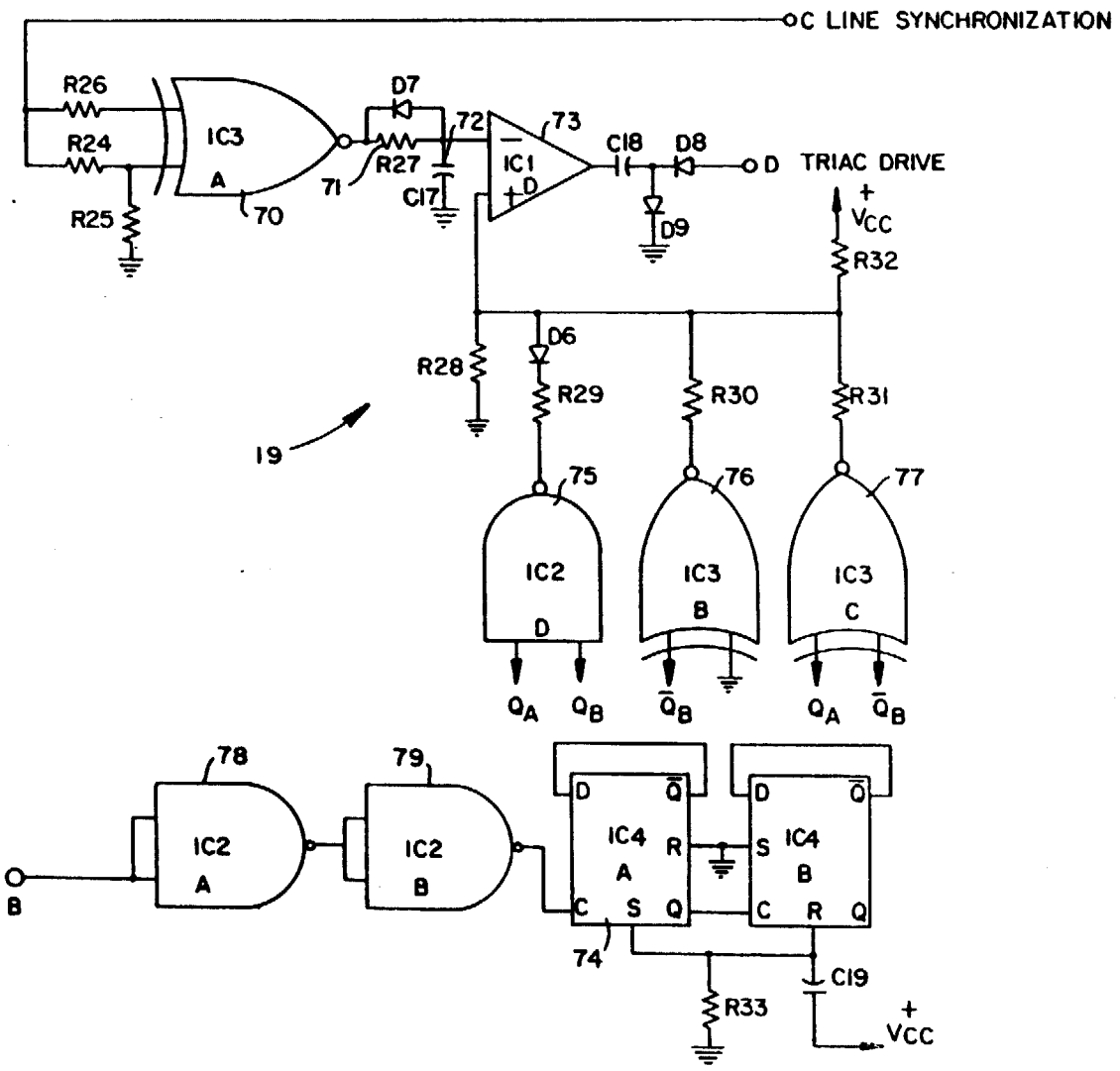
FIG. 8 is a circuit diagram of another portion of the first embodiment of the present invention and relates to the phase control.

As shown in FIG. 8, the triac phase control circuit 19 includes a zero crossing detector 70 (XNOR gate IC3-A-CD4077). A low to high transition occurs at zero crossing, which is integrated by RC network resistor 71 - capacitor 72, generating a logarithmic ramp at the inverting input of op-amp comparator 73. (IC1-D). The voltage at the non-inverting input of comparator 73 is determined by a digitally controlled voltage divider, consisting of ripple counter 74 (IC4A and B (DC 4013)) and gate 75 (IC3-C (CD 4077)). This voltage determines at what point on the ramp the comparator will kick negative, thus firing the triac via point D. Schmidt triggers 78 (IC2-A (CD 4093)) and IC2-B (CD 4093)) square up the input signal for application to the lock input of ripple counter 74. This circuit produces the sequence OFF-DIM-INTERMEDIATE-FULL-OFF.

PREVENTION OF FALSE ACTIVATION

In its intended use as a consumer product, frequent false activation would make this device essentially useless. There are three external causes of oscillator frequency deviation which could cause false activation: (1) RF fields; (2) power line voltage variations; and (3) power line impedance to earth ground variations.

The philosophy of the commercial embodiment is to make the oscillator as resistant to external disturbance as possible and, in addition, provide means to sense external disturbances and lock out the power level advance circuitry when they occur.

Figure 15:
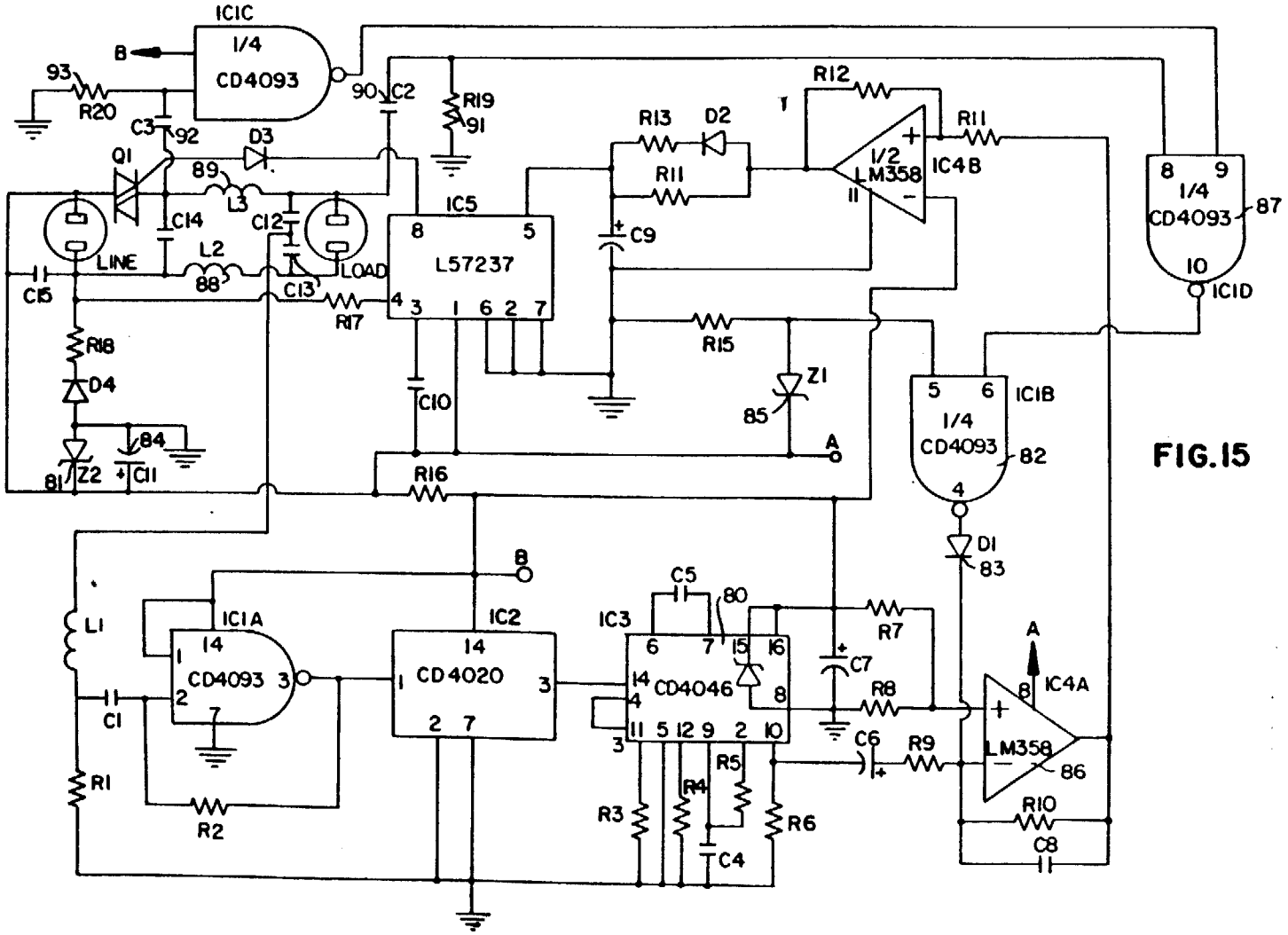
FIG. 15 is a detailed circuit diagram of the first embodiment of the present invention.

To effect line voltage glitch immunity, a combination of voltage regulation and logic circuitry is employed. As shown in FIG. 15, the voltage at point B is regulated to approximately 5.5 volts by an internal zener diode included in circuit 80 (IC3-CD4046). The voltage at point A is limited to 15 volts by zener diode 81 (Z2). As long as normal line voltage is present, zener diode 85 (Z1) will be in its reverse breakdown region and pin 5 of NAND gate 82 (IC1B-CD4093) will be high (about 4.5 volts). Thus the output of NAND gate 82 (IC1B) will be low, and consequently diode 83 (D1) will be reverse biased. When a power dropout occurs, the voltage at point A will immediately begin to drop as capacitor 84 (C11) discharges, and the voltage at pin 5, communicated through zener diode 85 (Z1) will drop accordingly. When the voltage at pin 5 reaches the lower trigger level (about 2.5 volts, the output of NAND gate 82 (IC1B) will go high. This forward biases diode 83 (D1) and pulls the inverting input of amplifier 86 (IC-4A-½LM358) high. The amplifier output will thus be forced to ground, locking out the subsequent power level advance circuitry. Thus, touch control is locked out before a low voltage condition can change the oscillator frequency.

To effect RF field immunity, as shown in FIG. 15, NAND gate 87 (IC1D-¼CD4093) is connected to the load side of decoupling chokes 88 (L2) and 89 (L3). When no RF interference exists, the output of this gate is high (normal condition). Differential RF voltage existing between the power line and the lamp cord of sufficient amplitude will drive this gate, configured as an inverting buffer, in synchronism. When the output of this gate goes low, it will cause the output of gate 82 (IC1B) to go high, thus inhibiting power level advance as previously detailed. Capacitor 90 (C2) and resistor 91 (R19) control the sensitivity, and hence the trip point, of the RF glitch inhibit system. Thus, touch control is locked out before an RF field can change the oscillator frequency.

One problem with the RF glitch lockout system is the RF field generated by the triac. The transient generated by the transition of the triac to the conducting state creates a burst of energy within the frequency spectrum to which the RF lockout will react. Thus, if the sensitivity of the RF sense circuit is made high enough to be useful, the device will lock itself out. This problem is solved by synchronizing the RF detent circuit with the firing of the triac. Network capacitor 92-resistor 93 (C3-R20) communicates positive going triac pulses to inverting buffer IC1C, whose output causes pin 9 of NAND gate 87 of IC1D (normally high) to go low whenver the triac fires. Pin 8 of NAND gate 87 IC1D (normally low) goes high when the triac fires. Therefore, the output of NAND gate 87 IC1D does not change state, making the circuit immune to triac generated energy.

The operating frequency of the oscillator is nominally 3 Mc, found empirically to have the greates immunity to ambient RF and power line frequency impedance variations. The frequency divider is a CD4020 type (14 stage) providing a division factor of 16,384. This provides a time delay of approximately 5 milliseconds, allowing the RF glitch lockout sufficient time to react, plus a high degree of oscillator frequency time averaging.

The circuit detailed herein is totally immune to false activation even in an adverse environment.

DIGITAL IMPLEMENTATION

This section deals with an all digital method and hardware to implement the entire device on one integrated circuit chip, except line interface and power supply components. All functions performed by the hybrid digital/analog circuitry described in the previous section are simulated in the all-digital version by soft ware routines.

Figure 9:
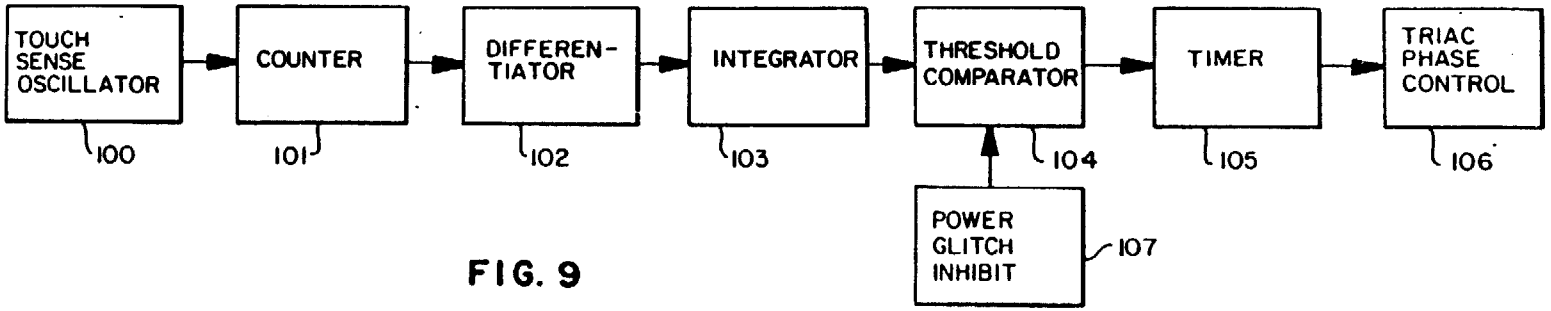
FIGS. 9 and 10 are block diagrams of a second embodiment of the present invention which is a digital embodiment.

The general approach is shown in FIG. 9. The touch sense oscillator 100 is identical to that in the hybrid version. Oscillator 100 is connected to a counter 101 which is enabled for a precisely controlled time interval. The value in the counter at the end of the time interval is proportional to oscillator frequency. The counter 101 is connected to a differentiator 102 since only changes in oscillator frequency are of interest. The differentiator 102 is connected to an integrator 103 which averages out residual 120 cps frequency modulation due to triac triggering and small random deviations. The integrator 103 is connected to the threshold comparator 104 which determines whether a frequency shift is large enough to be considered a valid touch input. The threshold comparator 104 is connected to the timer 105 which insures that the threshold comparator 104 is true for sufficient time before a valid touch input is indicated. A validated touch input advances the triac phase control 106 by one step. The power glitch inhibit 107 locks out touch control on power on and power dropouts until a re-equilibration period has passed.

Figure 10:
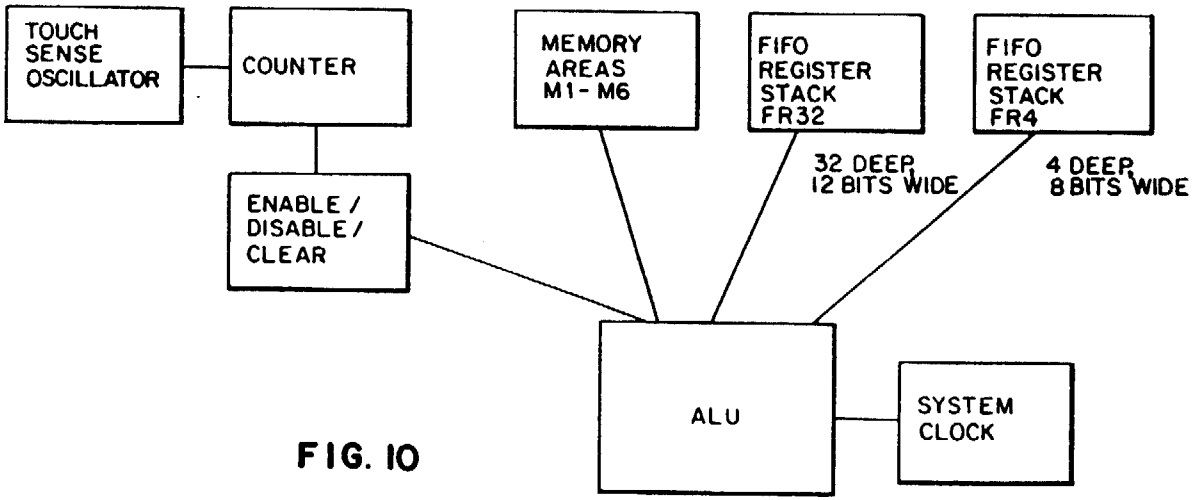

The hardware shown in FIG. 10 is essentially a micro-controller executing a fixed supervisor routine. The touch sense oscillator 100 is asynchronous with the system clock. The ALU provides signed binary addition and subtraction, shifting, memory access and general micro-code execution. Two FIFO register stacks are implemented for moving average calculations. Power glitch detection sets a flag when disturbances in the line voltage occur.

Figure 11:
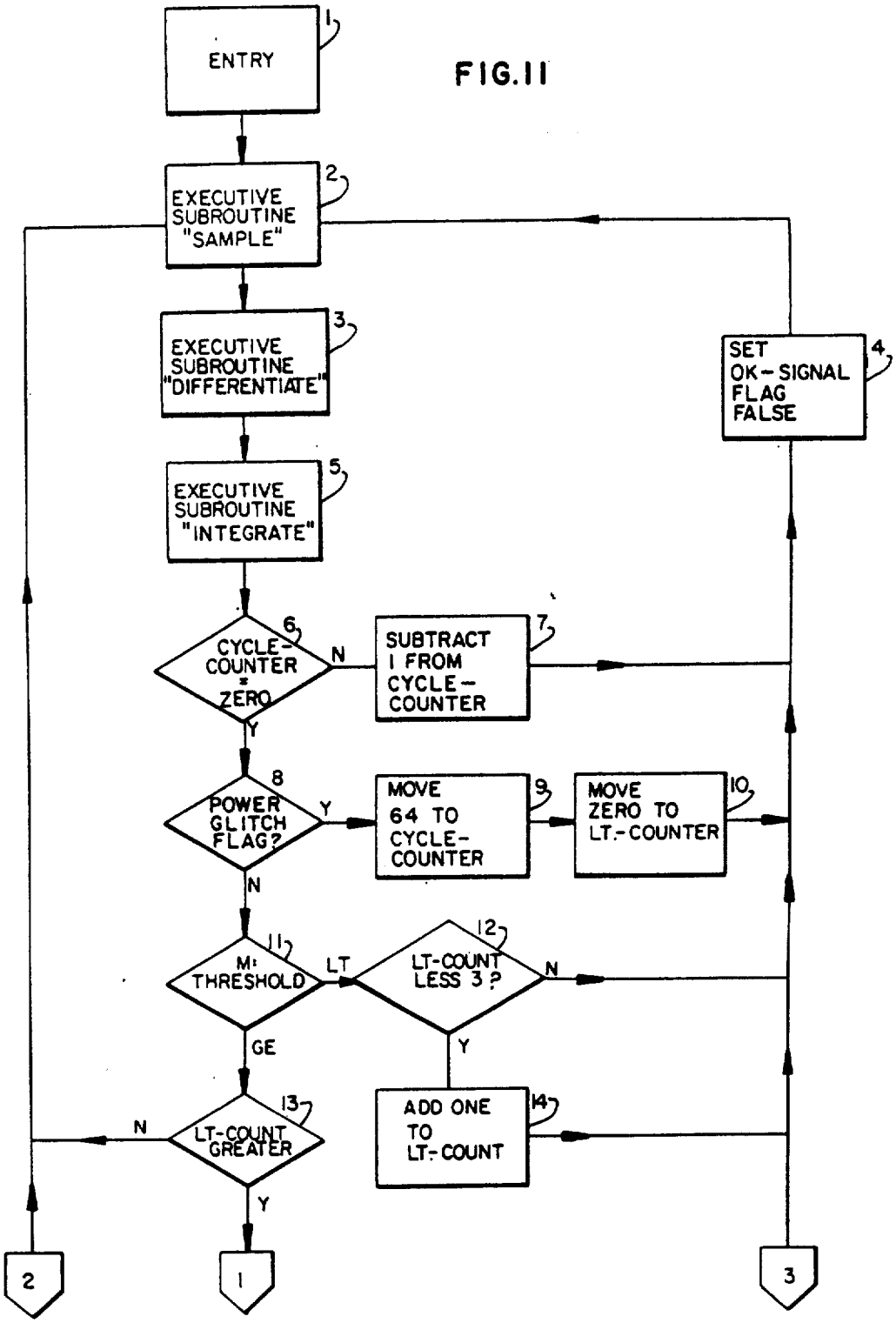
FIGS. 11, 11A and 12 are flow charts illustrating the software of the digital embodiment.
Figure 11A:
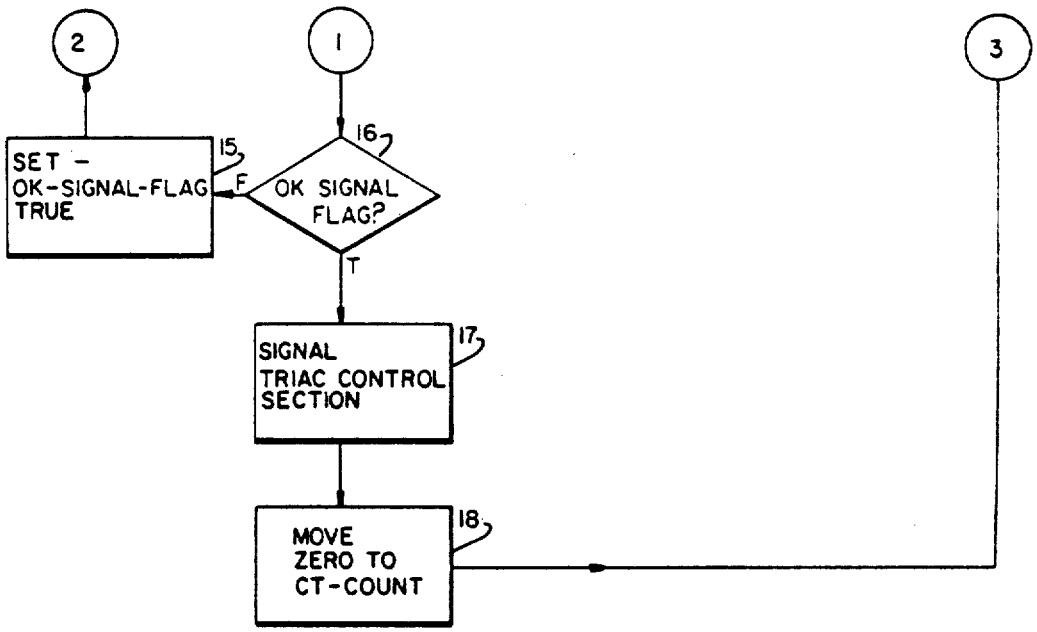
Figure 12:
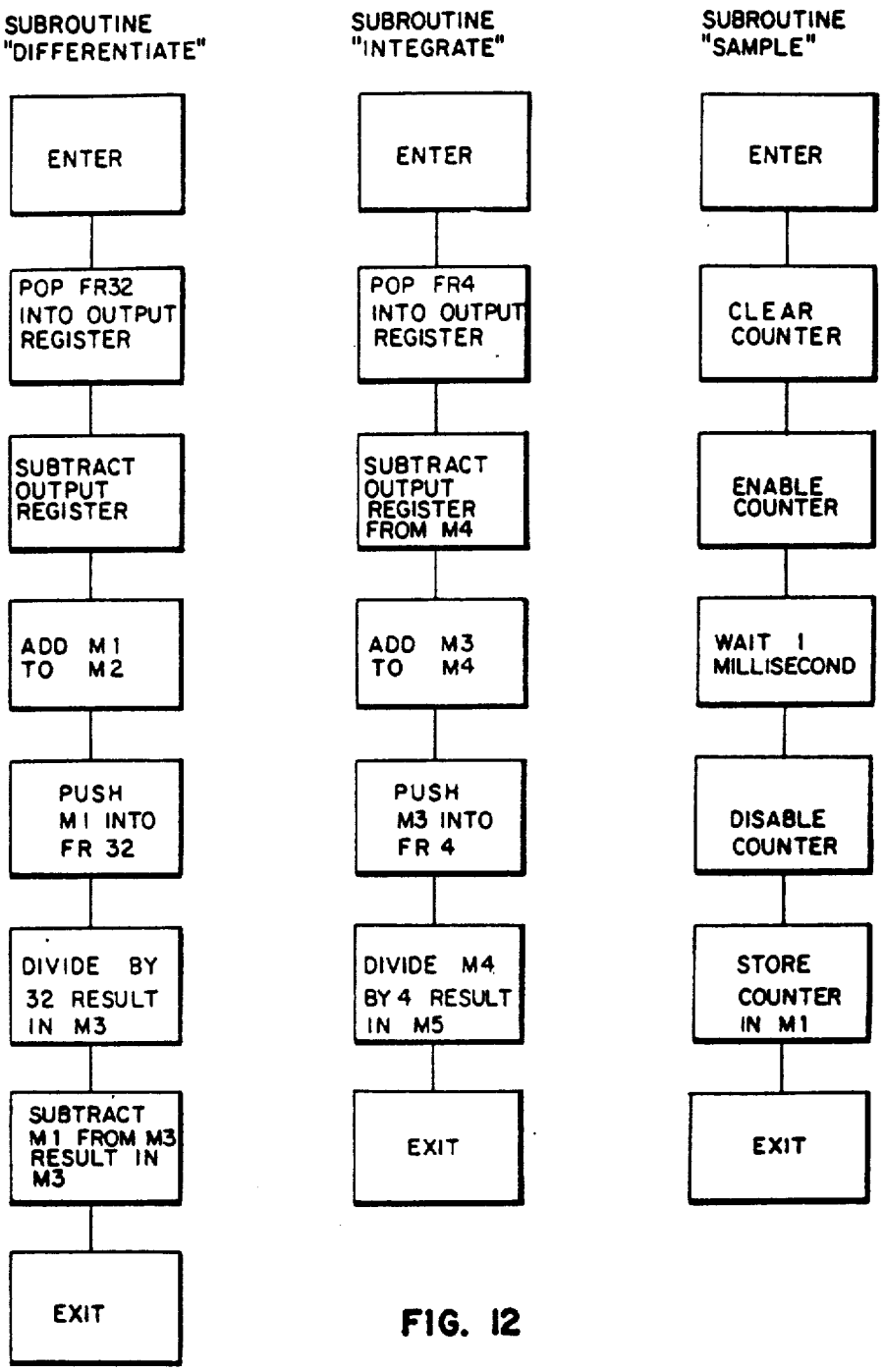

The mainline routine, shown in FIG. 11, is executed every 25 milliseconds. Thus, the oscillator is sampled 40 times per second. Certain software functions are shown as subroutines for ease of presentation. The end result of the software is to signal the triac phase control 106 (on chip) to advance one power level if a valid touch has occurred. The subroutine 'SAMPLE' counts the number of oscillator pulses in a one millisecond interval. The subroutine 'DIFFERENTIATE' subtracts the present oscillator frequency from the average value over the last 32 samples, and thus responds only to abrupt changes. The subroutine 'INTEGRATE' provides a moving average of the changes in oscillator frequency over the period 4 sample cycles to smooth out random variations. The output of 'INTEGRATE' is compared to a fixed threshold value. If it is higher than the threshold for two consecutive sample cycles, the triac control circuit will be advanced one power level. The output of 'INTEGRATE' must then be less than the threshold for two consecutive sample cycles (i.e. touch removed) before the triac control can be advanced again, thus implementing the timer function. A Power Glitch indication locks out touch response for 64 consecutive sample cycles.

SOFTWARE CONTROL FLOW

Normal Idling Loop—When idling in equilibrium, the control flow is 2-3-5-6-8. At step 11, the integrator output (M5), which would be zero, will test less than the threshold, and the control flow will continue 12-4-2. Thus, the oscillator frequency is being continuously tested. If the oscillator does shift frequency, but not enough to trip the threshold (or in the wrong direction) the above routine would still be followed.

Touch Sensed—The control flow will be 2-3-5-6-8 as above, but at step 11 M5 will test greater or equal and fall through to 16. At 16, OK-SIGNAL-FLAG (1 bit indicator, will test false, be set TRUE at 15, and control will jump back to 2. If, on the next cycle, M5 is still greater than the threshold, control will pass to 17, and the triac control circuit will be advanced one power level. Thus, we see that two consecutive cycles must occur with M5 greater or equal to the threshold, as required. After the triac control is signaled, LT-COUNT (4 bits, used to tally the number of times M5 is less than the threshold) is set to zero, Ok-SIGNAL-FLAG is set off at 4, and control passes back to 2.

Second Touch Sense—Two cycles must elapse with M5 less than the threshold (touch removed) before the triac control can be signaled again. Since LT-COUNT is set to zero after the triac control is signaled, M5 must test less at step 11 twice before step 13 will pass control to the triac routine.

Power Glitch Routne—When the line voltage level changes abruptly, the power glitch flag will go on. This occurs on power-up, power dropout, or power surge. This routine locks out touch sensing until the unit has time to re-equilibrate. If the power flag tests TRUE at step 8, the software enters a loop which causes 64 sample cycles to go by before touch sense is re-enabled.

Subroutine 'SAMPLE'—Takes 1 millisecond samples of the oscillator frequency. Since the frequency is about 2.5 Mc, the samples will be about $2500_{10}$, requiring a 12 bit counter.

Subroutine 'DIFFERENTIATE'—Subtracts the latest sample from a moving average of the last 32 samples. Thus, if the oscillator frequency is decreasing, the output will be positive. A FIFO register stack is used to maintain the moving storage.

Subroutine 'INTEGRATE'—Maintains a moving average of the last 4 numbers passed from the 'DIFFERENTIATE' routine. Smoothes out random variations.

ANALOG/DIGITAL PRACTICAL EMBODIMENT

FIG. 15 details one suggested preferred embodiment of a tested and commercial analog/digital embodiment which employs commercially available components.

What is claimed is:

1. An electronic control module to control the power to a lamp from an AC power source, the control module having a means to control the power to the lamp, said lamp having an external conductive surface and a two-conductor power cord within the lamp, said power to be controlled by touching said external conductive surface; characterized in that said control module removably plugs into said power source and the control module is not physically connected to the lamp except by the power cord, said power cord is removably insertable into the control module so that any lamp with a conductive external surface may be thus controlled, wherein the only connection between the lamp and control module is the said power cord and the only communication path between the lamp structure and the said power cord is the distributed capacitance existing between them; said control module including a high-frequency oscillator [having an operating frequency above the commercial AM broadcast band] and inductor means to electrically decouple the lamp power cord from the power source at said oscillator frequency, the said oscillator responding to touch to the lamp external conductive surface, such touching of said external conductive surface increasing the lamp capacitance, which change of capacitance is communicated to the oscillator through the power cord, and the oscillator being controlled by the combined capacitance of the lamp and power cord.

2. An electronic control module as in claim 1 further including in said semiconductor means a triac phase control circuitry.

3. An electronic control module as in claim 1 further including a frequency selective filter to discriminate between valid touch information and random disturbances.

4. An electronic control module as in claim 1 wherein said module includes a microprocessor controller executing a fixed supervisor routine, said routine including sampling of the oscillator frequency, integration of the sampled frequencies to produce an integrated digital quantity and comparison of the integrated quantity with a predetermined threshold.

5. An electronic control module as in claim 1 and employing means to sense interruptions in power line voltage and inhibiting false actuation by said interruptions.

6. An electronic control module as in claim 1 further including means to sense ambient electromagnetic fields intense enough to interfere with oscillator operation and inhibiting false actuation by said ambient electromagnetic fields.

7. An electronic module as in claim 1 wherein said inductor means includes inductors in series with each side of the power line to isolate said lamp cord from the power line at oscillator operating frequency.

8. An electronic control module as in claim 1 wherein said oscillator includes an astable multivibrator.

9. An electronic control module as in claim 1 further including a frequency divider and an demodulator to convert the frequency deviation of said oscillator to corresponding voltage variations.

10. An electronic control module as in claim 1 further including in said power control means a phase controlled triac.

11. An electronic control module as in claim 1 wherein said module includes a microprocessor executing a fixed algorithm, said algorithm including periodic sampling of the oscillator frequency, time averaging of said sampled frequencies to produce an integrated digital quantity and comparison of said integrated quantity to the instantaneous oscillator frequency.

12. An electronic control module as in claim 1, said module further including: means, including level comparators, frequency selective filters and timing circuitry to assess the magnitude of said oscillator responses to distinguish between valid touch control input and disturbances causes by external electromagnetic fields.

13. An electronic module as in claim 1 wherein said oscillator has an operating frequency greater than 2 MHz.

14. An electronic module as in claim 1, further including means to detect ambient electromagnetic fields of sufficient intensity to interfere with said touch sense oscillator operation such that false actuation can be inhibited.

15. An electronic control module as in claim 1 and employing means to sense interruptions in power line voltage and inhibiting false actuation therefrom.

16. An electronic control module as in claim 1 wherein said oscillator includes a high frequency current source to force charge into said combined capacitance of the lamp and power cord.

* * * * *